(12) United States Patent
Fang

(10) Patent No.: US 10,485,108 B1
(45) Date of Patent: Nov. 19, 2019

(54) METHOD OF CONFORMAL COATING

(71) Applicant: Jerry T. Fang, Palos Verdes Estates, CA (US)

(72) Inventor: Jerry T. Fang, Palos Verdes Estates, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 210 days.

(21) Appl. No.: 15/471,909

(22) Filed: Mar. 28, 2017

(51) Int. Cl.
| | |
|---|---|
| *H05K 3/00* | (2006.01) |
| *H05K 3/28* | (2006.01) |
| *H05K 1/02* | (2006.01) |
| *B05D 3/00* | (2006.01) |
| *B05D 1/02* | (2006.01) |
| *B05B 12/00* | (2018.01) |
| *B05B 9/03* | (2006.01) |

(52) U.S. Cl.
CPC ............. *H05K 3/285* (2013.01); *B05B 9/03* (2013.01); *B05B 12/00* (2013.01); *B05D 1/02* (2013.01); *B05D 3/007* (2013.01); *H05K 1/0237* (2013.01); *H05K 3/0091* (2013.01); *H05K 2203/0736* (2013.01); *H05K 2203/1366* (2013.01); *H05K 2203/1377* (2013.01)

(58) Field of Classification Search
CPC ........ B05D 1/02; B05D 3/007; H05K 1/0237; H05K 3/0091; H05K 3/285; H05K 2203/0736; H05K 2203/1366; H05K 2203/1377
USPC ................................................ 427/96.2–96.6
See application file for complete search history.

(56) References Cited

U.S. PATENT DOCUMENTS

| | | | | |
|---|---|---|---|---|
| 5,175,023 | A * | 12/1992 | Iwase ..................... | C08J 3/091 427/335 |
| 8,148,830 | B2 * | 4/2012 | Bedinger ............ | H01L 23/3192 257/790 |
| 2012/0153285 | A1 * | 6/2012 | James ................... | H01L 51/107 257/57 |
| 2017/0194171 | A1 * | 7/2017 | Peterson ................ | H01L 21/50 |

* cited by examiner

*Primary Examiner* — Brian K Talbot
(74) *Attorney, Agent, or Firm* — Tarolli, Sundheim, Covell & Tummino LLP

(57) ABSTRACT

A method of, and system for, providing an amorphous fluorinated polymer conformal coating to an RF circuit board is described. A coating solution including the amorphous fluorinated polymer dissolved in a fluorinated solvent is provided. The coating solution is applied to the RF circuit board via a mechanically controlled fluid spray application device to produce a coated board. A predetermined time period is waited for substantial evaporation of the fluorinated solvent from the coated board, thus leaving behind a conformal coating of the amorphous fluorinated polymer on a board surface area.

6 Claims, 3 Drawing Sheets

METHOD OF CONFORMAL COATING

TECHNICAL FIELD

This disclosure relates to a method and system of conformal coating and, more particularly, to a system and method of providing an amorphous fluorinated polymer conformal coating to at least one side of an RF circuit board.

BACKGROUND

Unlike most circuit board assemblies, which have a protective conformal coating, radiofrequency ("RF") board assemblies are normally exposed directly to air during use without any coating, for fear of degrading their electrical performance. However, damaging incidents can occur due to this lack of coating, and these incidents could cause a manufacturer and/or user to incur long troubleshooting times and, potentially, performance problems that are difficult to remedy. These incidents could have a potentially large negative impact on RF projects and manufacturer/user costs and schedules. For example, splattering of solder on the finished but uncoated high reliability RF board assemblies during the sealing of a package housing with a cover selectively plated with solder can occur and cause undesirable short-circuits on the RF board assemblies. If such splattering occurred onto a conformal coating, the resulting short-circuit effects could be greatly reduced or even eliminated. This hydrophobic coating can also reduce undesirable corrosion effects upon the electric/electronic circuitry of the RF board assemblies.

GVD Corporation, of Cambridge, Mass., currently uses vapor phase processes to deposit a coating of Teflon™ brand polytetrafluoroethylene (available from The Chemours Company, of Wilmington, Del.) onto MEMS chips or wafer-type circuit boards in a thin enough layer that the RF performance of these items is not adversely affected. However, the coating chamber size for GVD's process is very small (a maximum of about 4" diameter circular board assemblies can be accommodated), and the coating cannot cover the solder balls of ball grid array components, so this process is not practical for most RF board assemblies, which are substantially larger.

Generally, Teflon™ is known as being able to be applied as a conformal or corrosion protective coating as a film along even a large circuit board or part, but this film-coating application process results in a conformal coating that is thicker than desired for desired high precision and reliability performance of any RF circuit board assembly. Currently known brush- or dip-coating processes are not able to coat a consistently thin enough layer of Teflon™ on an RF circuit board assembly to achieve the desired conformal coating performance results.

SUMMARY

In an embodiment, a method of providing an amorphous fluorinated polymer conformal coating to an RF circuit board is described. A coating solution including the amorphous fluorinated polymer dissolved in a fluorinated solvent is provided. The coating solution is applied to the RF circuit board via a mechanically controlled fluid spray application device to produce a coated board. A predetermined time period is waited for substantial evaporation of the fluorinated solvent from the coated board, thus leaving behind a conformal coating of the amorphous fluorinated polymer on a board surface area.

In an embodiment, a system for providing an amorphous fluorinated polymer conformal coating to an RF circuit board is described. A supply of a coating solution includes a solution of the amorphous fluorinated polymer with a fluorinated solvent. A mechanically controlled fluid spray application device is provided for applying the coating solution to the RF circuit board to produce a coated board. The amorphous plastic achieves a conformal coating on a board surface area responsive to the fluorinated solvent being selectively evaporated from the coated board.

BRIEF DESCRIPTION OF THE DRAWINGS

For a better understanding, reference may be made to the accompanying drawings, in which.

DESCRIPTION OF ASPECTS OF THE DISCLOSURE

This technology comprises, consists of, or consists essentially of the following features, in any combination.

Figure 1:
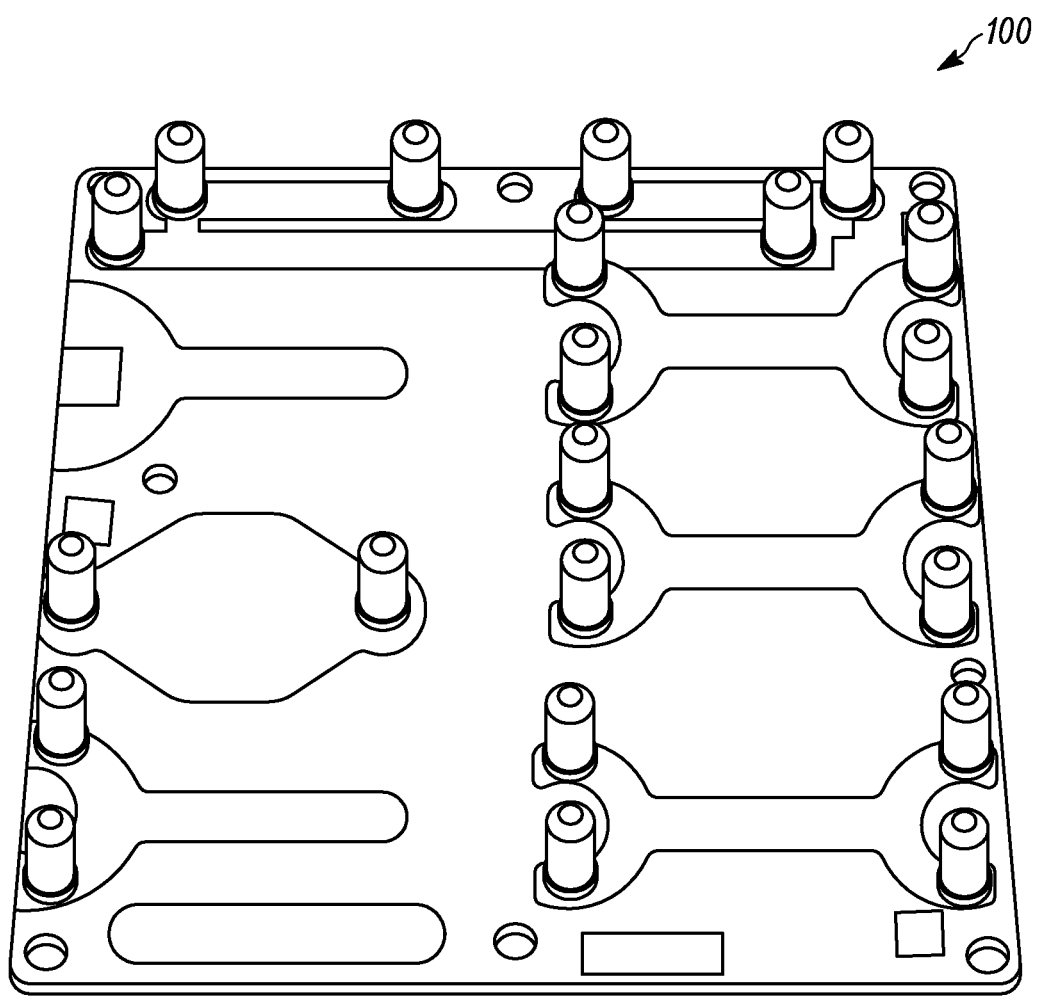
FIG. 1 is a plan view of a circuit board according to the prior art, with which an aspect of the invention can be utilized.

FIG. 1 depicts a plain, uncoated radiofrequency ("RF") circuit board assembly 100 as known in the art, shown in this Figure as being assembled with surface mount connectors. Radiofrequency and microwave printed circuit boards ("PCBs") and components assembled on the PCB, hereafter collectively "RF circuit board assemblies" 100, are a type of PCB designed to operate on signals in the megahertz to gigahertz frequency ranges (medium frequency to extremely high frequency). These frequency ranges are used for communication signals in everything from mobile phones to military radars. The materials used to construct these RF circuit board assemblies 100 are advanced composites with very specific characteristics for dielectric constant (Er), loss tangent, co-efficient of thermal expansion ("CTE"), and hydrophobicity. Most circuit board designers prefer not to include a (protective) conformal coating on RF circuit board assemblies 100 because of known adverse effects of the coating with high dielectric constant upon the electrical performance characteristics of the RF circuit board assemblies. The RF circuit board assembly 100 shown in FIG. 1 is a relatively simple version which is mainly intended for use in checking the performance of the various board design features after coating. Most printed circuit board assemblies intended to be placed into regular service before coating are populated with a number of much more complicated components, with many circuit traces being gold-plated.

Figure 2:
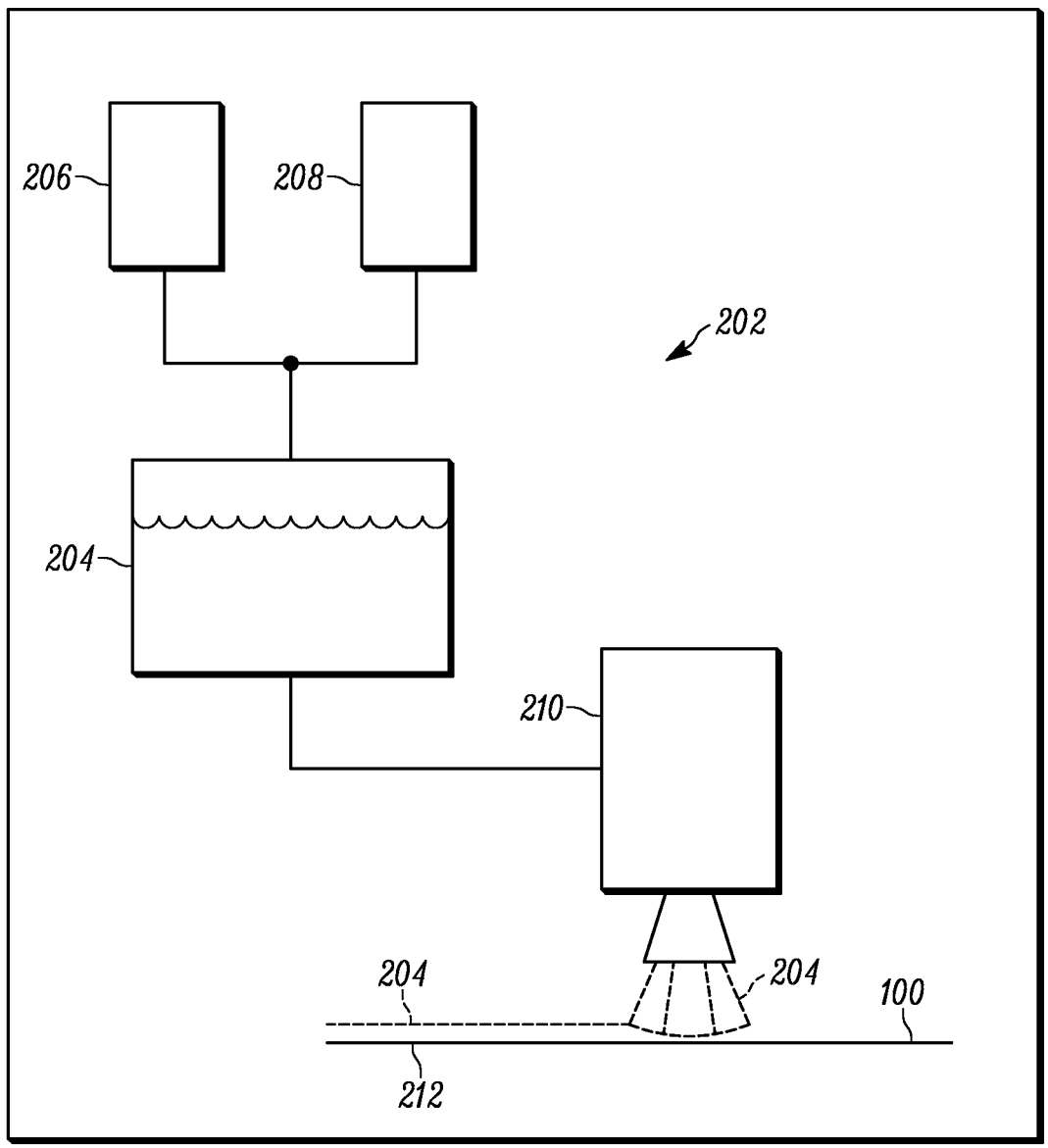
FIG. 2 is a schematic diagram of one aspect of the invention.

FIG. 2 schematically depicts a system 202 for providing an amorphous fluorinated polymer conformal coating to an RF circuit board assembly 100. The system 202 includes a supply of a coating solution 204 including the amorphous fluorinated polymer dissolved in a fluorinated solvent. The coating solution 204 could be provided in any desired format, including, but not limited to, a premixed solution in a container which can be used for filling an applicator. For example, for many use applications of the system 202, the coating solution will consist of Teflon™ AF amorphous fluorinated polymer resin (available from The Chemours Company, of Wilmington, Del.) 206 dissolved in Vertrel™ XF hydrocarbon fluid solvent (available from The Chemours Company, of Wilmington, Del.) 208. The amorphous fluorinated polymer resin 206 could be, for example, in the range of 2-10% by weight dissolved in 98-90% by weight hydrocarbon fluid solvent 208.

Teflon™ AF is a family of amorphous fluoropolymers based on copolymers of 2,2-bistrifluouomethyl-4,5-difluoro-1,3-dioxole (PDD) and tetrafluoroethylene (TFE). Teflon™ AF has the chemical structure shown below.

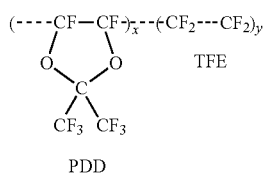

The glass transition temperature (Tg) of Teflon™ AF is a function of PDD content in mol %. When the PDD content is about 40 mol %, the Tg is 90° C. Another example of a fluorinated polymer resin 206 that can be used is Cytop® 809M, available from AGC Chemicals Europe of Amsterdam, the Netherlands and having a formula Poly 1,1,2,4,4,5,5,6,7,7-decafluor-3-oxa-1,6-heptadiene.

Vertrel™ XF is a fluorinated-hydrocarbon solvent and will be generally referenced herein as a fluorinated solvent 208. Another example of a suitable fluorinated solvent 208 is the perfluoronated solvents known as 3M™ Fluorinert™ Electronic Liquids FC-72, FC-75, and/or FC-40, available from 3M Corporation of St. Paul, Minn. ("Per" means higher content of fluorine atoms than normally used fluorinated solvents.)

The system 202 also includes a mechanically controlled fluid spray application device 210 for applying the coating solution 204 to a board surface area (e.g., a top side, a bottom side, and/or another desirably-coated surface) of the RF circuit board assembly 100 to produce a coated board assembly 212. For example, the mechanically controlled fluid spray application device 210 can be a spray nozzle coating device. The coating solution 204 could be applied to one or both sides of a substantially flat RF circuit board assembly. The fluid spray application device 210 is able to be tilted and angled with respect to the RF circuit board assembly 100 to achieve desired fluid-coating thicknesses even on cavities or discontinuities on the board surface. One example of a suitable fluid spray application device 210 is the Select Coat SC-280N/SC-280C Film Coater Applicator, available from Nordson Corporation of Westlake, Ohio.

The RF circuit board assembly 100 which is coated to become a coated board assembly 212 may have a (coated) board surface area of more than thirteen square inches on at least one of the top and bottom board sides. Teflon™ coating of panels having surface areas of less than about thirteen square inches (such as, for example, a four-inch diameter round wafer) is currently available commercially, but achieving desired coating of Teflon™ across larger surface areas is believed to be impossible. As another example, the RF circuit board assembly 100 which is coated to become a coated board assembly 212 may have a board surface with a length dimension of less than nineteen inches and a width dimension of less than seventeen inches, when the present system uses particularly configured known fluid spray application devices 210.

As, or shortly after, the fluid spray application device 210 applies the coating solution 204 to the RF circuit board, the fluorinated solvent 208 evaporates. Accordingly, only the amorphous fluorinated polymer resin amorphous fluorinated polymer resin 206 portion of the coating solution 204 will remain on the coated board assembly 212 following the passage of a predetermined time period from the initiation of fluid-spray application of the coating solution 204. For example, Vertrel™ XF has a boiling point of about 57° C., and will "dry" within about 5-10 minutes after application, depending upon factors such as the room temperature and any convective air currents. The fluorinated solvent 208 can also serve a "cleaning" function, to dissolve and carry away any residual contaminants on the coated board assembly 212.

Once sufficient fluorinated solvent 208 has evaporated from the coating solution 204 located on the coated board, the amorphous fluorinated polymer resin 206 remains on the board, and is adhered to the board by adhesion of the amorphous fluorinated polymer resin 206 molecules and building layers of those molecules on the board surface. That is, the amorphous fluorinated polymer resin 206 achieves a conformal coating on a board and/or component surface area responsive to the fluorinated solvent 208 being selectively evaporated from the coated board assembly 212. Because the fluorinated solvent 208 also serves as a cleaning agent and as a coolant during its evaporation, the deposition rate of the amorphous fluorinated polymer resin 206 molecules can be slowed down to enhance the adhesion to the assembly surfaces. The adhesion may be further enhanced by subjecting the coated board assembly 212 to vacuum baking at 70° C. to 80° C. and 25 to 100 mTorr for 1 to 2 hours to help reduce or even eliminate trapped solvent and pores.

As a result, the board surface area becomes protectively coated with a material (both type and amount) which avoids (and/or does not cause) undesirable interference with, or degradation of, the performance of the RF circuits on the coated board assembly 212. For example, the conformal coating could be in the range of 3-18 microns thick across the board surface area. As another example, due to its fluorine content and low dielectric constant, the thickness of the conformal coating varies by less than 15 microns across the board surface area to help reduce or avoid performance degradation while still protecting the circuit traces from accidental high heat exposure.

Figure 3:
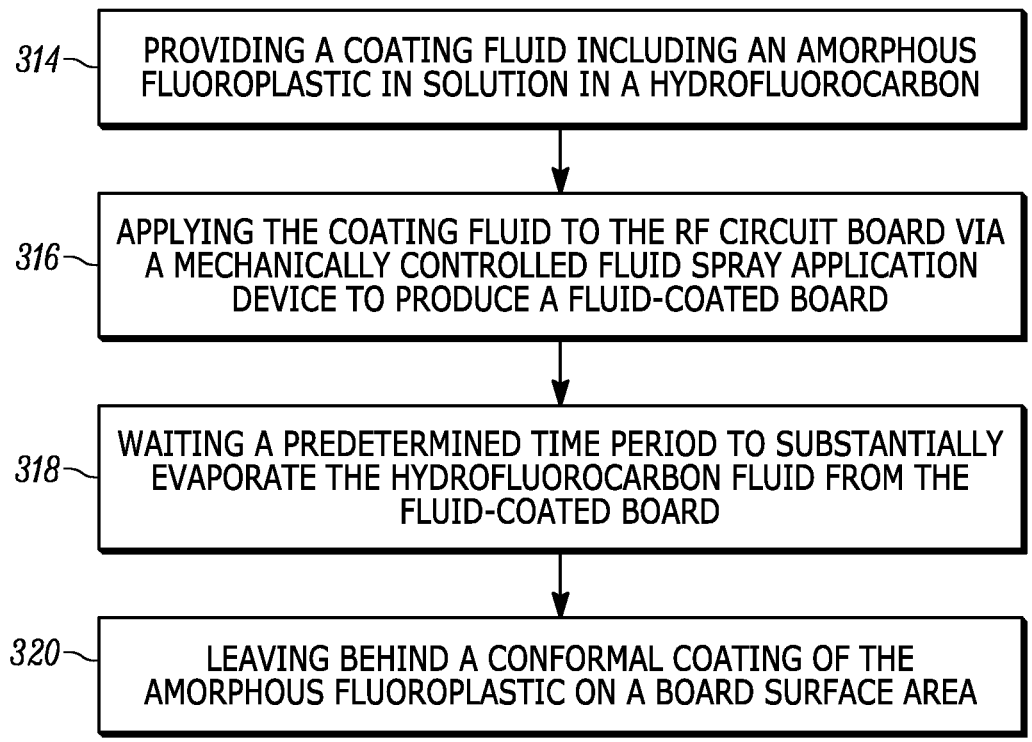
FIG. 3 is a flowchart of a method including an aspect of the invention.

A method of providing an amorphous fluorinated polymer 206 conformal coating to an RF circuit board assembly 100 is schematically described in FIG. 3. In first action block 314, a coating solution 204 including the amorphous fluorinated polymer 206 dissolved in a fluorinated solvent 208 is provided. The method then proceeds to second action block 316, where the coating solution 204 is applied to the RF circuit board assembly 100 via a mechanically controlled fluid spray application device 210 to produce a coated board assembly 212.

In third action block 318 of FIG. 3, the user waits a predetermined time period to substantially evaporate the fluorinated solvent 208 from the coated board assembly 212, thus leaving behind a conformal coating of the amorphous fluorinated polymer 206 on a board (and/or component) surface area. If the coating is tacky or porous, an optional vacuum baking at 70° C. to 80° C. and 25 to 100 mTorr for 1 to 2 hours, can be used to fully cure the coating.

If an error is made during the coating process, or through some other mechanism the coating solution 204 is applied to a surface for which a conformal coating is not desired, then the amorphous fluorinated polymer 206 (remaining after the fluorinated solvent 208 evaporates) can simply be removed from the unwanted portion(s) of the RF circuit board assembly 100, such as via wiping with a fluorinated solvent-dipped rag.

It is contemplated that the process shown in FIG. 3, or any other suitable process for coating the board assembly 100 according to aspects of the invention, could be carried out on both sides of the board assembly 100 concurrently, or could be at least partially performed on one (top or bottom, generally) side of the board assembly 100 at a time. For example, the board assembly 100 could be coated on a top side, and then flipped over to rest on the (coated) top side while the bottom side is coated.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. While the coated board assembly 212 is described, by way of example, as an RF circuit board assembly 100, it is contemplated that any type of circuit board, or any other device which is desired to provide with a conformal coating, could be similarly coated using the system 202 described herein. Any of the described structures and components could be disposable or reusable as desired for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

I claim:

1. A method of providing an amorphous fluorinated polymer conformal coating to at least one side of an RF circuit board, the method comprising:
   providing a coating solution including the amorphous fluorinated polymer dissolved in a fluorinated solvent;
   applying the coating solution to the RF circuit board via a mechanically controlled fluid spray application device to produce a coated board; and
   waiting a predetermined time period to substantially evaporate the fluorinated solvent from the coated board, thus leaving behind a conformal coating of the amorphous fluorinated polymer on a board surface area.

2. The method of claim 1, including applying the coating solution to the RF circuit board via a spray nozzle coating device to produce the coated board.

3. The method of claim 1, wherein the RF circuit board has a board surface area of more than 13 square inches.

4. The method of claim 1, wherein the RF circuit board has a board surface with a length dimension of less than 19 inches and a width dimension of less than 17 inches.

5. The method of claim 1, wherein the conformal coating is in the range of 3-18 microns thick across the board surface area.

6. The method of claim 1, wherein a thickness of the conformal coating varies by less than 15 microns across the board surface area.

\* \* \* \* \*